(12) United States Patent
Brown et al.

(10) Patent No.: US 12,650,448 B2
(45) Date of Patent: Jun. 9, 2026

(54) LEAKAGE CURRENT COMPENSATOR CIRCUIT

(71) Applicant: HELLA GMBH & CO. KGAA, Lippstadt (DE)

(72) Inventors: Alan W. Brown, Canton, MI (US); Martin Dierkes, Lippstadt (DE); Christian Buhlheller, Lippstadt (DE); André Körner, Lippstadt (DE); Christoph Wostmann, Lippstadt (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 169 days.

(21) Appl. No.: 18/663,282

(22) Filed: May 14, 2024

(65) Prior Publication Data

US 2025/0355026 A1 Nov. 20, 2025

(51) Int. Cl.
*G01R 19/10* (2006.01)
*G01R 15/18* (2006.01)
*G01R 19/00* (2006.01)

(52) U.S. Cl.
CPC ........... *G01R 19/10* (2013.01); *G01R 15/185* (2013.01); *G01R 19/0092* (2013.01)

(58) Field of Classification Search
CPC .. G01R 31/2623; G01R 31/261; G01R 21/06; G01R 19/30; G01R 19/00; G01R 15/144; G01R 15/12
See application file for complete search history.

(56) References Cited

U.S. PATENT DOCUMENTS

| | | | |
|---|---|---|---|
| 6,388,451 B1 * | 5/2002 | Burba | ................... B60W 20/00 |
| | | | 324/509 |
| 11,650,229 B2 | 5/2023 | Trombert | |
| 2011/0216452 A1 | 9/2011 | Haines et al. | |
| 2014/0210411 A1 * | 7/2014 | Fluxa | ........................ H02J 3/02 |
| | | | 320/109 |

(Continued)

FOREIGN PATENT DOCUMENTS

EP 2724443 B1 3/2016

OTHER PUBLICATIONS

European Search Report of the European Patent Office for Application No. EP25169146, dated Jul. 29, 2025, 2 pages.

*Primary Examiner* — Tung X Nguyen
(74) *Attorney, Agent, or Firm* — WARNER NORCROSS + JUDD LLP

(57) ABSTRACT

A leakage current compensator (LCC) circuit is provided. The LCC circuit includes a first residual current coil, a second residual current coil, and a current injector. The first residual current coil functions as an open loop measurement coil, while the second residual current coil functions as a closed loop measurement coil. Between these two residual current coils, the current injector injects a compensation current into a PE conductor. The open loop measurement coil measures any leakage current produced by the grid-connected device, while the closed loop measurement coil measures the actual leakage current remaining after compensation. The current injector allows the LCC circuit to actively cancel the leakage current by, first, injecting what is measured by the open loop measurement coil and, second, injecting an additional current as determined by a closed loop gain from the closed loop measurement coil.

19 Claims, 7 Drawing Sheets

(56) References Cited

U.S. PATENT DOCUMENTS

| | | | |
|---|---|---|---|
| 2019/0184833 A1 | 6/2019 | Elshaer et al. | |
| 2020/0212791 A1 | 7/2020 | Karinca et al. | |
| 2021/0048484 A1 | 2/2021 | Pfizenmaier et al. | |
| 2021/0257848 A1 | 8/2021 | Spesser et al. | |
| 2022/0029596 A1 | 1/2022 | Spesser et al. | |
| 2022/0402390 A1 | 12/2022 | Smolenaers | |
| 2023/0068600 A1 | 3/2023 | Al et al. | |

* cited by examiner

| Mode | S1 | S2 | S3 | S4 |
|---|---|---|---|---|
| 1 Phase Normal | On | Off | On | On |
| 1 Phase REVERSED | Off | On | On | On |
| U.S. 2Ph | Off | Off | On | On |
| 3Phase Y | On | Off | Off | Off |
| 3Phase Δ | On | Off | Off | Off |

FIG. 3

LEAKAGE CURRENT COMPENSATOR CIRCUIT

FIELD OF THE INVENTION

The present invention relates to leakage current compensation circuits for grid-connected devices, for example charging equipment for electric vehicles.

BACKGROUND OF THE INVENTION

A grid-connected device refers to an electrical device that is directly connected to an electrical grid. For example, grid-connected charging stations for electric vehicles (EVs) enable EV owners to charge their vehicle directly from the electrical grid. These charging stations can be installed in homes, businesses, or public locations and can help manage electricity demands and grid stability by allowing for controlled charging during peak hours and off-peak hours.

Grid-connected devices in three-phase systems typically include active current carrying power lines (L1, L2, L3), a neutral line (N), and a protective earth (PE) conductor. Other systems include fewer current carrying lines, such as U.S. split phase electrical systems (L1 and L2) and single-phase electrical systems (L1). For these and other systems, leakage currents are electrical currents that flow under conventional operating conditions in an undesired current path. Sometimes referred to as residual currents, leakage currents can occur for example from one of the current-carrying power lines to the PE conductor. The peak value and the RMS value of this leakage current is regulated by various standards for buildings and grid-connected EVs.

In an EV charging application in particular, an EV is charged via a cable that is connected to Electric Vehicle Service Equipment (EVSE). To meet electrical safety standards, the EVSE generally contains a residual current monitoring device that measures the level of residual current flowing into the PE conductor. If this residual current exceeds a threshold determined by the corresponding standard, it actively disengages the power to the grid-connected EV via internal EVSE relays.

Despite their existence, however, there remains a continued need for an improved system and method for compensating for leakage currents. In particular, there remains a continued need for an improved system and method for detecting and compensating for a leakage current found in grid-connected devices, particularly in applications involving non-isolated electronic power converters, including for example EVSE systems or also other technologies, such as heat pumps, air conditioners, and still others.

SUMMARY OF THE INVENTION

A leakage current compensator (LCC) circuit is provided. The LCC circuit includes a first residual current coil, a second residual current coil, and a current injector. The first residual current coil functions as an open loop measurement coil, while the second residual current coil functions as a closed loop measurement coil. Between these two residual current coils, the current injector injects a compensation current into a PE conductor. Both residual current coils may be provided as current transformers, summing all AC input lines and neutral line currents and transforming it by the winding ratio to the measurement winding, which is wound around the same magnetic core. The open loop measurement coil measures any leakage current produced by the grid-connected device, while the closed loop measurement coil measures the actual leakage current remaining after compensation. The current injector allows the LCC circuit to actively cancel the leakage current by, first, injecting what is measured by the open loop measurement coil and, second, injecting an additional or modified current as determined by a closed loop gain from the closed loop measurement coil.

The current injector is a dynamic current source for injecting a compensation current into the PE conductor. The current injector is connected between virtual ground and the PE conductor. The virtual ground is connected to the grid conductors between the closed loop measurement coil and the open loop measurement coil. This configuration allows a full return path for the leakage current compensation, thus allowing the LCC circuit to actively cancel the leakage current in the PE conductor by providing an alternative path for the leakage current, rather than into grid infrastructure. The LCC circuit may include four grid configuration relays for switching between three-phase operation and single-phase or two-phase operation. The grid configuration relays ensure compatibility with essentially any grid connected application, including three-phase Y electrical systems, three-phase delta electrical systems, U.S. split phase electrical systems, and single-phase electrical systems.

In another embodiment, a method for actively canceling a leakage current is provided. The method generally includes: (a) measuring the leakage current produced by the grid-connected device and its load(s) at an open loop measurement coil; (b) injecting a compensation current based on the measured leakage current; (c) measuring the actual leakage current remaining after a compensation current is applied to the PE conductor; and (d) modifying the compensation current based on a closed loop gain from a closed loop measurement coil.

Measuring the leakage current produced by the grid-connected device is performed at the open loop measurement coil. A first transimpedance amplifier converts an input current signal from the open loop measurement coil into a proportional output voltage signal. The current injector includes an op-amp closed loop gain function for providing an appropriate compensation current to the PE conductor. Measuring the compensated leakage current is performed at the closed loop measurement coil. A second transimpedance amplifier converts an input current signal from the closed loop measurement coil into a proportional output voltage signal. Modifying the compensation current is then performed by the current injector based on the output of a band-pass summing amplifier with separate gain factors for the open loop and closed loop compensation. The band-pass summing amplifier includes a first input terminal coupled to the sum of the output of the first and second transimpedance amplifiers, while the second input terminal is coupled to a virtual ground node. The current injector includes a first terminal coupled to the output of the band-pass summing amplifier and a second terminal coupled to the virtual ground node. The current injector injects a modified compensation current to reduce the leakage current according to a closed-loop control function. The modified compensation current further reduces the leakage current, optionally to less than a predetermined threshold, for example 2 mARMS (amps root-mean-square).

As discussed herein, embodiments of the present invention include an open loop reduction in leakage current and a closed loop reduction in leakage current. The open loop reduction includes continuously measuring the leakage current in the current carrying conductors for output to the band-pass summing amplifier. The closed loop reduction includes summing the open loop feedback of a first transimpedance amplifier with the closed loop feedback of a second transimpedance amplifier. The summed current measurements, as multiplied by open loop and closed loop gains, is output to the current injector for injecting a compensation current into the PE conductor. By providing an initial open loop reduction, the LCC circuit reduces the noise in the current carrying wires without relying solely on the closed-loop gain of the band-pass summing amplifier/functional block.

In other embodiments, the LCC circuit includes one, both not both, of the open loop measurement coil and the closed loop measurement coil. These embodiments are well suited for use with grid-connected devices that generate little noise, while providing cost savings over embodiments having both closed loop and open loop measurements of the leakage current.

For example, the LCC circuit can include only the closed loop current coil, which encompasses all active and neutral grid lines (L1, L2, L3, N) except the PE conductor. Alternatively, the LCC circuit can include only the open loop current coil. The LCC circuit also includes a virtual ground control circuit and includes a current injector. The current injector is a dynamic current source for injecting a compensation current in the PE conductor and is connected between the PE conductor and virtual ground. In operation, a transimpedance amplifier converts the current signal from the appropriate measurement coil into a proportional output voltage signal. The output voltage signal is then processed by a band-pass amplifier. The band-pass amplifier includes a differential amplifier allowing mid-band frequency components to pass while attenuating very low and very high frequencies. In particular, the band-pass amplifier includes a first input terminal coupled to the output of the transimpedance amplifier, while the second terminal is coupled to the virtual ground node ($V_{gnd}$). Modifying the compensation current is then performed by the current injector based on the output of the band-pass amplifier. The current injector includes a first terminal coupled to the output of the band-pass amplifier and a second terminal coupled to the virtual ground node ($V_{gnd}$). The current injector injects a modified compensation current to reduce the leakage current according to an open-loop gain function or a closed-loop gain function. The modified compensation current reduces the leakage current, optionally to less than a predetermined threshold.

Other embodiments include a system for open-loop and/or closed-loop compensation of a leakage current, the system including one or more digital signal processors (DSPs), microcontrollers, and/or other digital processors. For example, the system can include a DSP for open-loop and/or closed-loop compensation of the measured leakage current. The system also includes a first analog-to-digital converter (ADC) electrically coupled to the output of the open-loop measurement circuit and a second ADC electrically coupled to the output of the closed-loop measurement circuit. Each ADC converts an analog input (as received from a transimpedance amplifier) into a digital signal for the DSP. The DSP then performs an open loop reduction and/or a closed loop reduction of the leakage current. That is, the DSP causes the current injector to inject a modified compensation current to the PE conductor to reduce the leakage current in the current carrying lines according to the open-loop and/or closed-loop control function, optionally to less than a predetermined threshold.

Embodiments of the invention are not limited to the foregoing, as the present invention can include digital circuitry for the current injector and/or the virtual ground circuit. For example, the current injector can comprise a class D amplifier for converting a low-voltage DC input into a higher-voltage DC output. Instead of continuously varying the compensation current using an analog amplifier (e.g., class A, B, and AB amplifiers), the class D amplifier modulates the duty cycle of a pulse-width-modulated (PWM) waveform based on an input voltage and a desired output voltage. By controlling this duty cycle, the class D amplifier regulates the compensation current while minimizing power losses. In addition, the virtual ground circuit can comprise a second DSP in combination with an ADC and a digital-to-analog converter (DAC). For example, the second DSP (which may be the same as the first DSP) can actively maintain the DC average of virtual ground to be the same as the potential in the PE conductor. In particular, the second DSP can amplify the voltage difference between the PE conductor and a virtual ground node (Vgnd), while rejecting any signals that are common to both inputs, such as noise or interference. The DSP then generates a supply current for the current injector, which allows the compensation system to operate over a wider range of Vgnd.

These and other embodiments are well suited for a wide range of applications, including non-isolated on-board chargers for electric vehicles. Because non-isolated on-board chargers generate noise, for example from the electric vehicle or other loads, the LCC circuit is uniquely suited to compensate for noise currents in the PE conductor. While primarily described below in combination with a non-isolated on-board charger, the present invention is also well-suited for use with an onboard charger having an isolation transformer.

These and other features and advantages of the present invention will become apparent from the following description of the invention, when viewed in accordance with the accompanying drawings and the appended claims. It will be appreciated that any of the preferred and/or optional features of the invention may be incorporated alone, or in appropriate combination, within embodiments of the invention, while still falling within the scope of claim 1, even if such combinations are not explicitly claimed in the appended claims.

BRIEF DESCRIPTION OF THE DRAWINGS

FIG. 3 is a logic table for the leakage current compensator circuit of FIG. 1.

DETAILED DESCRIPTION OF THE PRESENT EMBODIMENTS

Figure 1:
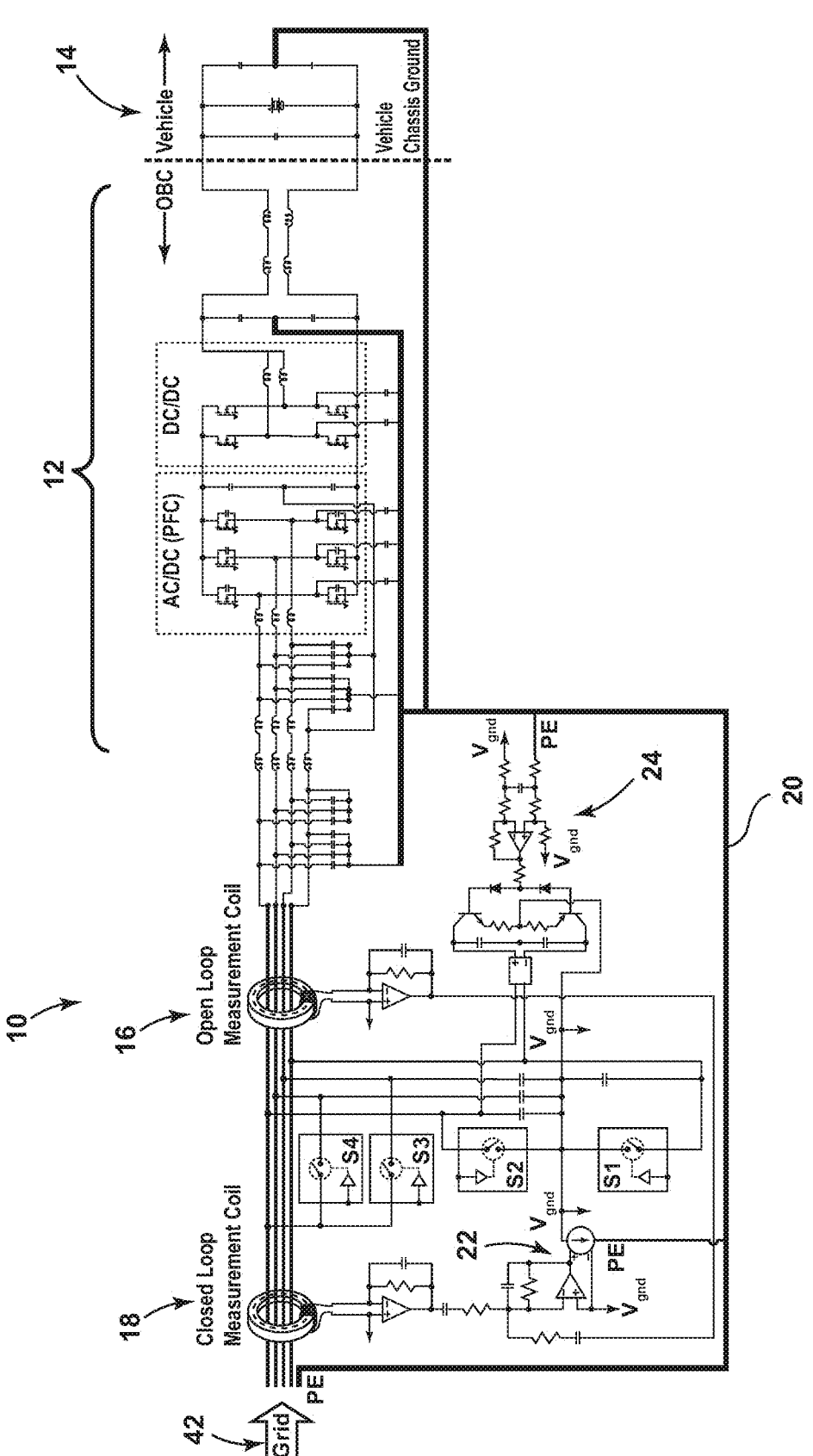
FIG. 1 is a circuit diagram of a leakage current compensator circuit coupled to an on-board charger in accordance with one embodiment of the invention.

Referring to FIG. 1, a leakage current compensator (LCC) circuit in accordance a first embodiment is illustrated and generally designated 10. The LCC circuit 10 is coupled to an onboard charger 12 for providing a regulated DC voltage to a vehicle 14. More particularly, the LCC circuit 10 includes first and second residual current coils 16, 18 encompassing all active and neutral grid lines (L1, L2, L3, N) except the PE conductor 20. Under normal operating conditions, the vector sum of the currents in all active phases is zero. If a grid-connected device is producing a leakage current, however, then the sum of the currents in the active phases is not equal to zero, indicating the presence of a non-zero current in the PE conductor. Of note, the present invention is not limited to residual current coils for measuring an electrical current (sometimes referred to as current sensing coils or a current transformers), as other current sensors/sensing circuits can be used in other embodiments, whether now known or hereinafter developed.

To detect and compensate for a leakage current, the first residual current coil 16 functions as an open loop measurement coil, while the second residual current coil 18 functions as a closed loop measurement coil. The open loop measurement coil 16 measures any leakage current produced by the grid-connected device 12, 14, while the closed loop measurement coil 18 measures the actual leakage current remaining after compensation. The leakage current can be measured in other ways, optionally using a digital signal processor. Between these two residual current coils, a current injector 22 injects a compensation current into the PE conductor 20. The current injector 22 allows the LCC circuit 10 to actively cancel the leakage current by, first, injecting what is measured by the open loop measurement coil 16 and, second, injecting an additional current as determined by a closed loop gain from the closed loop measurement coil 18. A virtual ground control circuit 24 actively maintains the DC average of a virtual ground to be the same as the potential in the PE conductor 20, thereby permitting the use of a low-voltage current injector. Each such aspect of the LCC circuit 10 will now be discussed in greater detail below.

Figure 2:
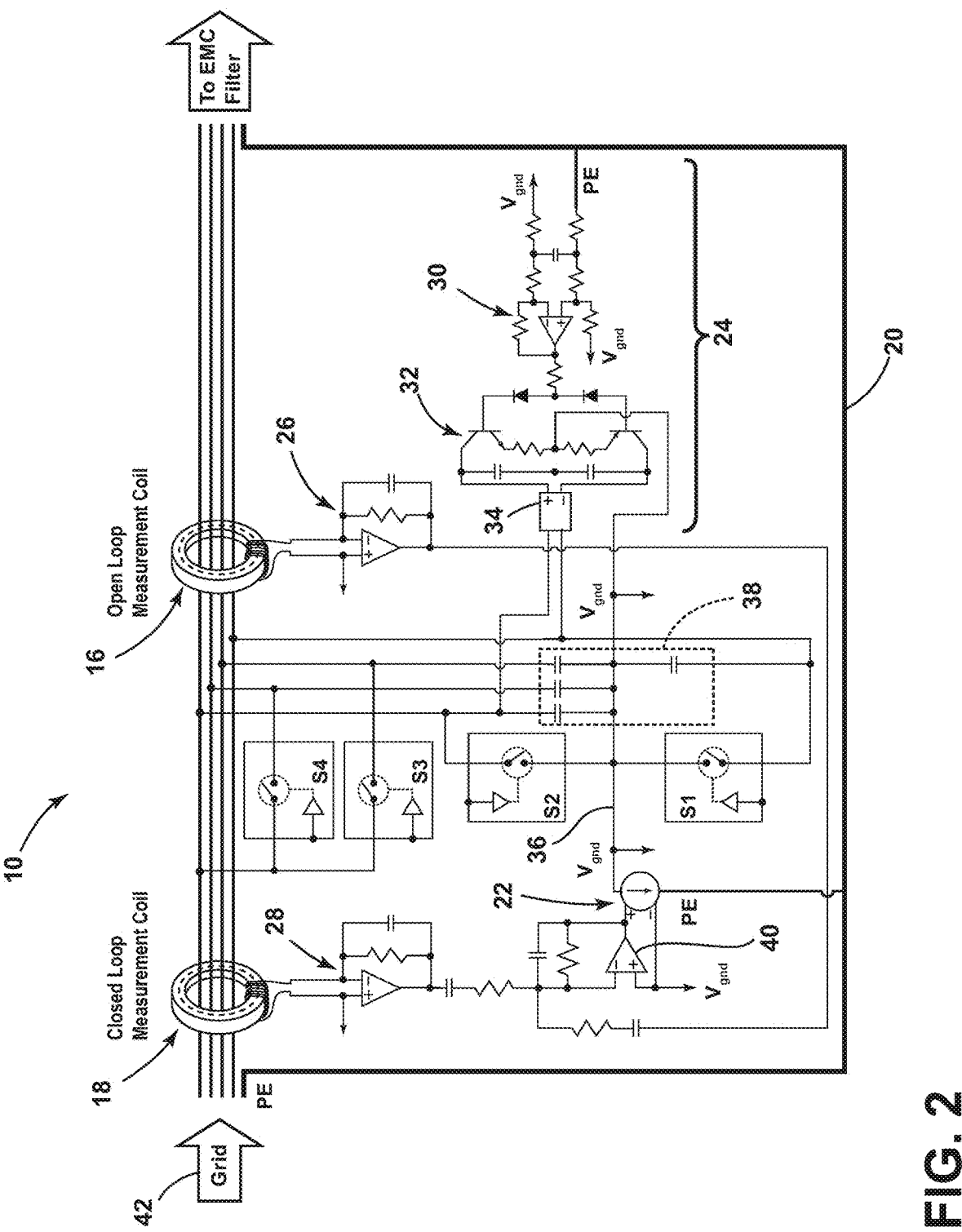
FIG. 2 is a circuit diagram of the leakage current compensator circuit of FIG. 1.

Of note, the grid conductors depicted in FIGS. 1-2 include four current carrying wires L1, L2, L3, N for a three-phase Y connection. In other embodiments, however, the grid conductors can include fewer current carrying wires as appropriate for three-phase delta electrical systems, U.S. split phase electrical systems, and/or single-phase electrical systems.

As best shown in FIG. 2, the open loop measurement coil 16 is a current transformer having a toroid-shaped core made of magnetic material, through which the live (L1, L2, L3) and neutral (N) conductors pass. The conductors (L1, L2, L3, N) make up coupled primary windings each with 1-turn, while a single coupled secondary winding, having more turns, is connected to a first transimpedance amplifier 26, which converts the secondary winding current to a voltage. The closed loop measurement coil 18 is also a current transformer having a toroid-shaped core made of magnetic material, through which the live (L1, L2, L3) and neutral (N) conductors pass. The conductors (L1, L2, L3, N) make up coupled primary windings each with 1-turn, while a single coupled secondary winding, having more turns, is connected to a second transimpedance amplifier 28 which converts the secondary winding current to a voltage. As explained below, the open loop measurement coil 16 measures the leakage current produced by the grid connected device 12 (FIG. 1) and its electrical load 14 (FIG. 2), while the closed loop measurement coil 18 measures the difference between the live and neutral conductors and measures the actual leakage current remaining after open loop compensation.

As noted above, the LCC circuit 10 includes a virtual ground control circuit 24. The virtual ground control circuit 24 includes a differential amplifier 30 that amplifies the voltage difference between the PE conductor 20 and a virtual ground node ($V_{gnd}$), while rejecting any signals that are common to both inputs, such as noise or interference. A symmetry filter processes the output of the differential amplifier 30 to extract symmetrical components while suppressing asymmetrical components. A grid-powered current source 32, in turn, generates a variable, controlled current during U.S. split phase (two-phase) operation or three-phase operation. The virtual ground control circuit 24 also includes a full-wave rectifier 34 to generate the supply current for the virtual ground control circuit 32, which allows the LCC circuit 10 to operate over a wider range of $V_{gnd}$. The current injector 22 is a dynamic current source for injecting a compensation current in the PE conductor 20. The power supply for the current injector 22 is not shown, but can be powered by a bipolar low voltage supply whose magnitude is less than +/−60V and grounded to $V_{gnd}$ and isolated from PE. As also shown in FIG. 2, the current injector 22 is connected between the PE conductor 20 and virtual ground 36, which is coupled into the active phases. This configuration allows a full return path for the leakage current compensation to be made, thus allowing the LCC circuit 10 to actively cancel the leakage current in the PE conductor by providing an alternative path for the leakage current to flow, rather than back into the grid infrastructure.

As also shown in FIG. 2, the LCC circuit 10 optionally includes four grid configuration relays S1, S2, S3, S4 for switching between three-phase operation and single-phase or two-phase operation. In particular, the first relay S1, when closed, couples the neutral conductor (N) to the virtual ground node ($V_{gnd}$), and the second relay S2, when closed, couples the first current carrying wire (L1) to the virtual ground node ($V_{gnd}$). In addition, the third relay S3, when closed, couples the first current carrying wire (L1) to the third current carrying wire (L3), while the fourth relay S4, when closed, couples the first current carrying wire (L1) to the second current carrying wire (L2). The virtual ground network includes a plurality of capacitors 38 that act as an averaging circuit, such that the virtual ground node ($V_{gnd}$) is close to the potential of the PE conductor 20, thus allowing a low voltage to inject into the PE conductor 20.

Operation of the grid configuration relays S1, S2, S3, S4 is further illustrated in FIG. 3. In single phase normal operation, the first relay S1, the third relay S3, and the fourth relay S4 are on (conducting), while the second relay S2 is off (non-conducting). In single-phased reversed operation, the first relay S1 is off (non-conducting), while the second relay S2, the third relay S3, and the fourth relay S4 are on (conducting). For U.S. two-phase operation, the first relay S1 and the second relay S2 are off (non-conducting), while the third relay S3 and the fourth relay S4 are on (conducting). For three-phase Y electrical systems and three-phase delta electrical systems, the first relay S1 is on (conducting), while the remaining relays S2, S3, S4 are off (non-conducting).

Turning now to a method of operation, the LCC circuit 10 includes circuitry (analog and/or digital) for actively canceling the leakage current according to the following method steps: (a) measuring the leakage current produced by the grid-connected device and its load(s) at the open loop measurement coil; (b) injecting a compensation current based on the measured leakage current; (c) measuring the actual leakage current remaining after a compensation current is applied to the PE conductor; and (d) modifying the injection current based on a closed loop gain from the closed loop measurement coil. Each such step is separately discussed below.

Measuring the leakage current produced by the grid-connected device is performed at the open loop measurement coil 16. The first transimpedance amplifier 26 converts the input current signal from the open loop measurement coil 16 into a proportional output voltage signal. This voltage signal represents the leakage current produced by the grid connected device, optionally an onboard charger 12 or an electric vehicle 14. The leakage current is carried by wires (L1, L2, L3, N) that electrically connect the grid voltage 42 to the grid-connected device.

Injecting a compensation current based on the measured leakage current includes applying a compensation current to the PE conductor 20. The current injector 22 includes an op-amp closed loop gain function for providing an injection current to the PE conductor 20. For a grid frequency of 50/60 Hz, for example, the compensation current can include a sinusoidal waveform with a frequency of between 5 Hz and 20 kHz.

The step of measuring the compensated leakage current is performed at the closed loop measurement coil 18. This step includes converting the input current signal from the closed loop measurement coil 18 into a proportional output voltage signal. This step is performed by the second transimpedance amplifier 28, which includes a first input coupled to an op-amp and a second input that is grounded to a reference voltage. The second transimpedance amplifier 28 also includes a transimpedance resistor coupled between the output and the inverting input of the op-amp. The output of the second transimpedance amplifier 28 is then processed by a band-pass summing amplifier 40. The band-pass summing amplifier 40 includes a differential amplifier having a non-inverting input and an inverting input, thereby allowing mid-band frequency components to pass while attenuating very low frequencies and very high frequencies.

Modifying the compensation current is then performed by the current injector 22 based on the output of the band-pass summing amplifier 40. In particular, the band-pass summing amplifier 40 includes a first input terminal coupled to the sum of the output of the first and second transimpedance amplifiers 26, 28, while the second terminal is coupled to the virtual ground node (V$_{gnd}$). The current injector 22 includes a first terminal coupled to the output of the band-pass summing amplifier 40 and a second terminal coupled to the virtual ground node (V$_{gnd}$). The current injector 22 injects a modified compensation current to reduce the leakage current according to a closed-loop control function. The modified compensation current reduces the leakage current, optionally to less than a predetermined threshold, for example 2 mARMS.

To reiterate, the system and the method of the present invention include an open loop reduction in leakage current and a closed loop reduction in leakage current. The open loop reduction includes continuously measuring the leakage current in the current carrying conductors (L1, L2, L3, N) for output to the band-pass summing amplifier 40. The closed loop reduction includes summing the open loop feedback (which is relatively constant) of the first transimpedance amplifier 26 with the closed loop feedback of the second transimpedance amplifier 28. The summed current measurements, as multiplied with separate gain factors for the open loop and closed loop compensations, is output to the current injector 22 for injecting a compensation current into the PE conductor 20. By providing an initial open loop reduction, the LCC circuit 10 reduces the noise in the current carrying wires without relying solely on the closed-loop gain of the band-pass summing amplifier 40.

Figure 4:
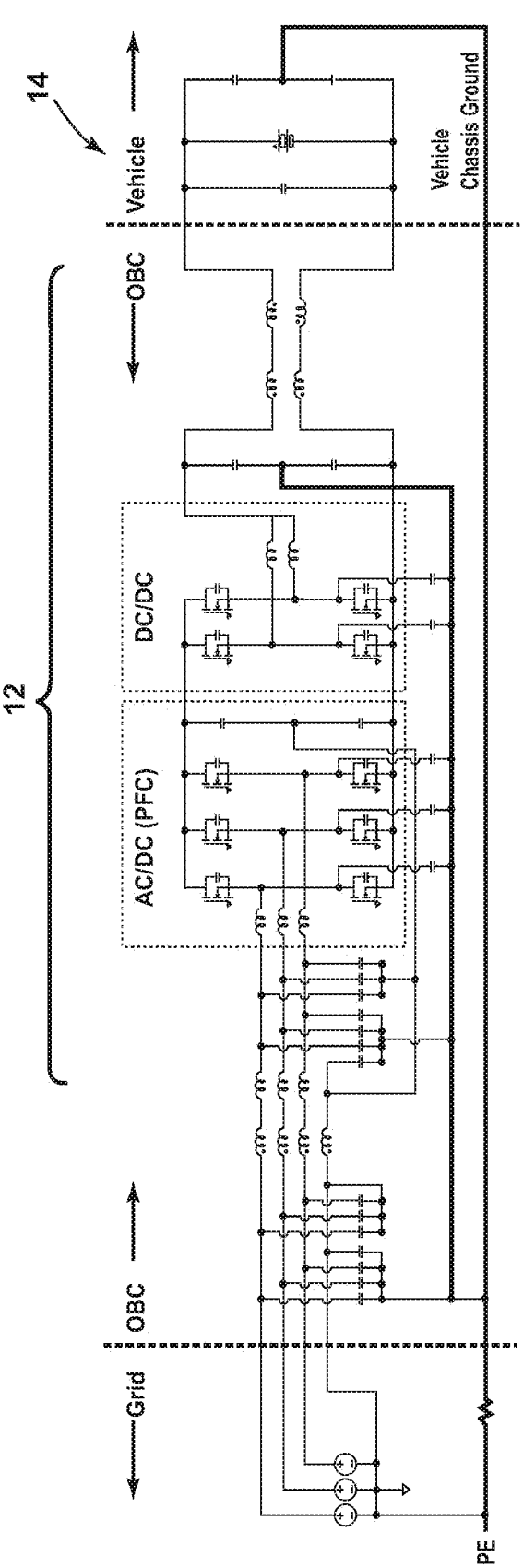
FIG. 4 is a circuit diagram of the on-board charger of FIG. 1.

The present invention is well suited for a wide range of applications, including on-board chargers for electric vehicles, thereby guarding against shock hazards to persons and equipment. An on-board charger 12 is depicted in FIG. 4, which includes power factor correction (PFC) circuitry and a non-isolated DC/DC converter for providing a regulated DC output to a vehicle 14. Because non-isolated DC/DC converters generate noise, for example from the vehicle 14 or other loads, the LCC circuit 10 is uniquely suited to compensate for noise currents (i.e., leakage currents from 5 Hz to 20 kHz) in the PE conductor. While illustrated as a non-isolated DC/DC converter, the present invention is also well-suited for use with an onboard charger having an isolated DC/DC converter. In addition, the present invention can be applied to any grid connected application, including three-phase Y electrical systems, three-phase delta electrical systems, U.S. split phase electrical systems, and single-phase electrical systems.

Figure 5:
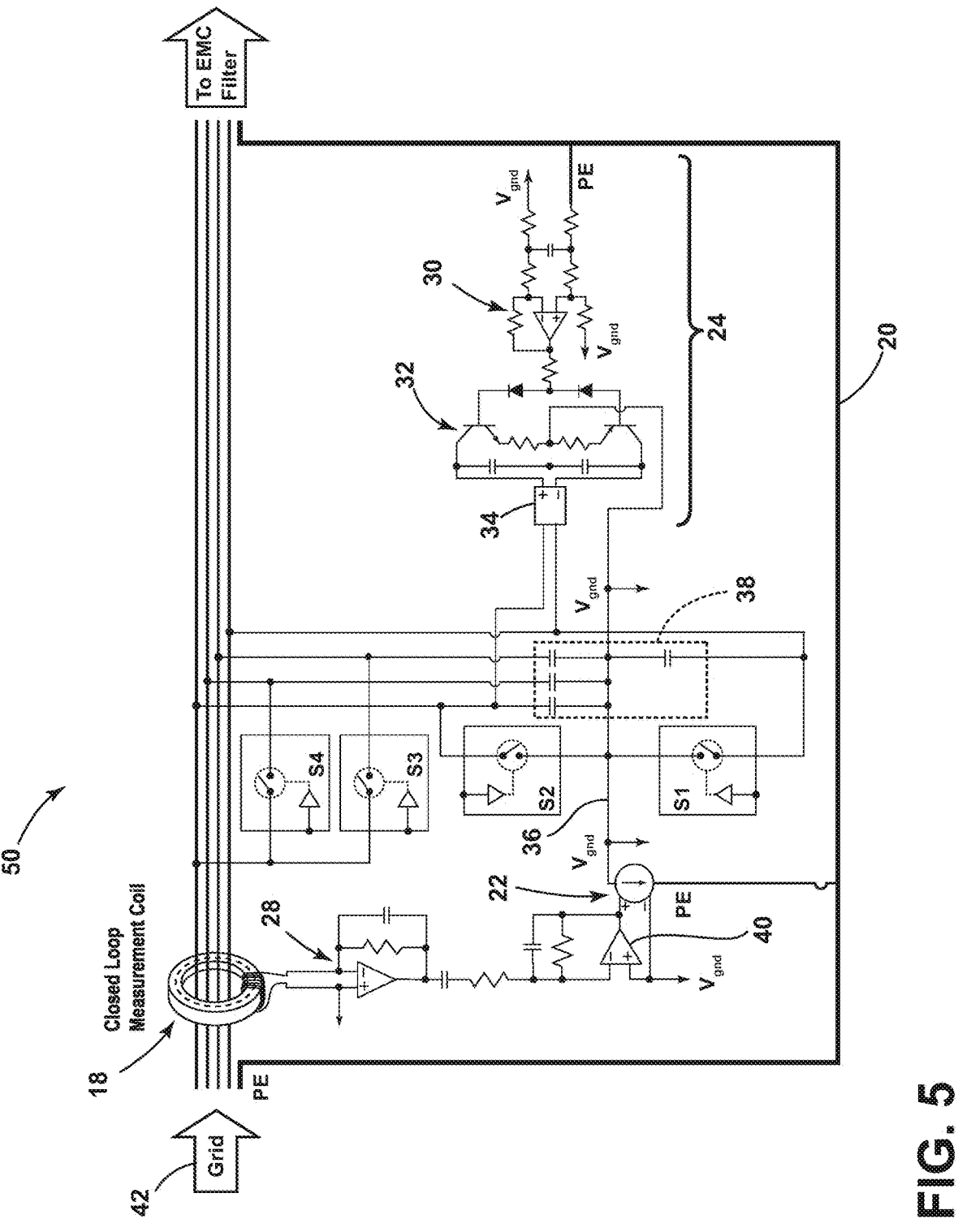
FIG. 5 is a circuit diagram of a leakage current compensator circuit in accordance with a second embodiment, having closed loop compensation of a leakage current.

Referring now to FIG. 5, an LCC circuit in accordance with another embodiment is illustrated and generally designated 50. The LCC circuit 50 of FIG. 5 differs from the LCC circuit 10 of FIG. 2, in that the LCC circuit 50 of FIG. 5 includes only closed loop measurement of the leakage current. This embodiment is well suited for use with grid-connected devices that generate little noise, while providing cost savings over embodiments having both closed loop and open loop measurements of the leakage current produced by the grid-connected device.

In particular, the LCC circuit 50 includes only the second residual current coil 18, which encompasses all active and neutral grid lines (L1, L2, L3, N) except the PE conductor 20. As with the embodiment of FIG. 2, the residual current coil comprises a current transformer, summing all AC input lines and neutral line currents and transforming it by a winding ratio to the measurement winding, which is wound around the same magnetic core. The LCC circuit 50 of FIG. 5 is otherwise structurally and functionally identical to the LCC circuit 10 of FIG. 2. For example, the LCC circuit 50 includes a virtual ground control circuit 24 and includes a current injector 22. The current injector 22 is a dynamic current source for injecting a compensation current in the PE conductor 20. The current injector 22 is connected between the PE conductor 20 and virtual ground 36, which is coupled into the active phases.

In operation, the transimpedance amplifier 28 converts the current signal from the closed loop measurement coil 18 into a proportional output voltage signal. The output of the transimpedance amplifier 28 is then processed by a band-pass summing amplifier 40. The band-pass summing amplifier 40 includes a differential amplifier having a non-inverting input and an inverting input, thereby allowing mid-band frequency components to pass while attenuating very low frequencies and very high frequencies. Modifying the compensation current is then performed by the current injector 22 based on the output of the band-pass summing amplifier 40. In particular, the band-pass amplifier 40 includes a first input terminal coupled to the output of the transimpedance amplifier 28, while the second terminal is coupled to the virtual ground node (V$_{gnd}$). The current injector 22 includes a first terminal coupled to the output of the band-pass summing amplifier 40 and a second terminal coupled to the virtual ground node (V$_{gnd}$). The current injector 22 injects a modified compensation current to reduce the leakage current according to the closed-loop control function. The modified compensation current reduces the leakage current, optionally to less than a predetermined threshold.

Figure 6:
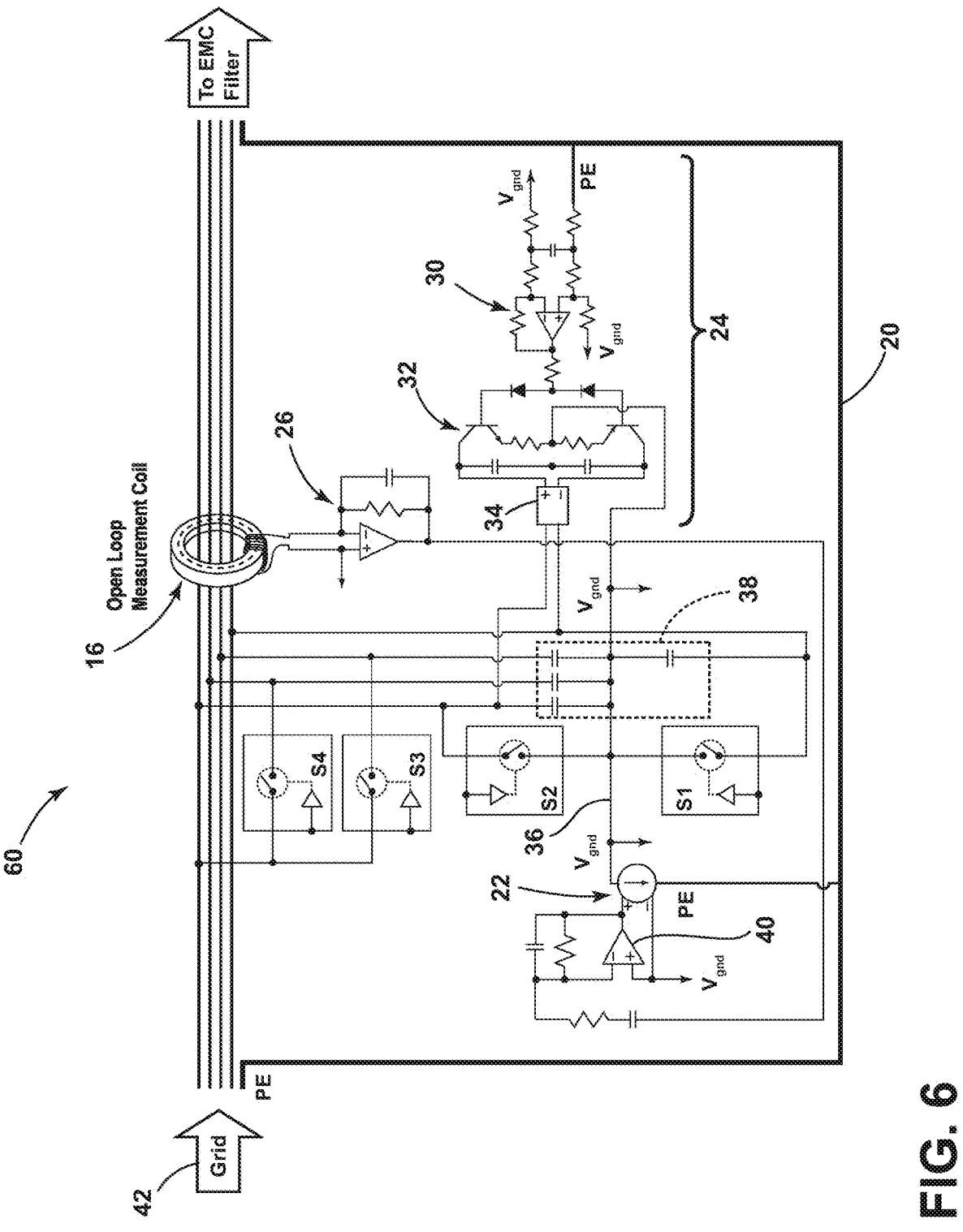
FIG. 6 is a circuit diagram of a leakage current compensator circuit in accordance with a third embodiment, having open loop compensation of a leakage current.

Referring now to FIG. 6, an LCC circuit in accordance with another embodiment is illustrated and generally designated 60. The LCC circuit 60 of FIG. 6 differs from the LCC circuit 10 of FIG. 2, in that the LCC circuit 60 of FIG. 6 includes only open loop measurement of the leakage current. Like the embodiment of FIG. 5, the embodiment of FIG. 6 is well suited for use with grid-connected devices that generate little noise, while providing cost savings over embodiments involving both closed loop and open loop measurements of the leakage current.

In particular, the LCC circuit 60 includes only the first residual current coil 16, which encompasses all active and neutral grid lines (L1, L2, L3, N) except the PE conductor 20. As with the embodiment of FIG. 2, the first residual current coil comprises a current transformer, summing all AC input lines and neutral line currents and transforming it by a winding ratio to the measurement winding, which is wound around the same magnetic core. The LCC circuit 60 of FIG. 6 is otherwise structurally and functionally identical to the LCC circuit of FIG. 2. For example, the LCC circuit 60 includes a virtual ground control circuit 24 with a full-wave rectifier 34 to generate a supply current for the virtual ground control circuit 32. The current injector 22 is a dynamic current source for injecting a compensation current in the PE conductor 20. As also shown in FIG. 6, the current injector 22 is connected between the PE conductor 20 and virtual ground 36, which is coupled into the active phases.

In operation, the transimpedance amplifier 26 converts the current signal from the open loop measurement coil 16 into a proportional output voltage signal. The output of the transimpedance amplifier 26 is then processed by the band-pass summing amplifier 40. The band-pass summing amplifier 40 includes a differential amplifier having a non-inverting input and an inverting input, thereby allowing mid-band frequency components to pass while attenuating very low frequencies and very high frequencies. Modifying the compensation current is then performed by the current injector 22 based on the output of the band-pass summing amplifier 40. In particular, the band-pass amplifier 40 includes a first input terminal coupled to the output of the transimpedance amplifier 28, while the second terminal is coupled to the virtual ground node ($V_{gnd}$). The current injector 22 includes a first terminal coupled to the output of the band-pass summing amplifier 40 and a second terminal coupled to the virtual ground node ($V_{gnd}$). The current injector 22 injects a modified compensation current to reduce the leakage current according to the open-loop control function, optionally to less than a predetermined threshold.

Figure 7:
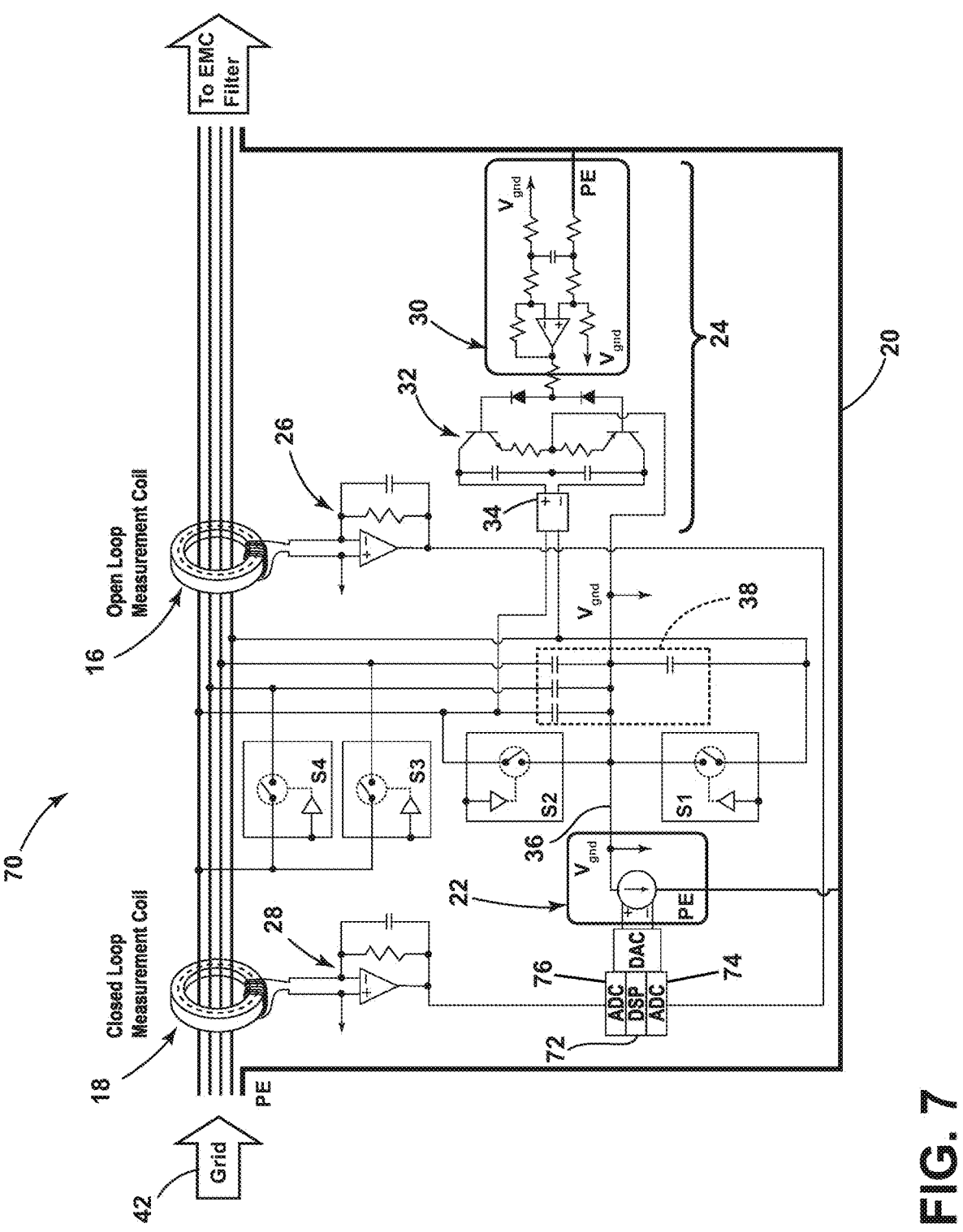
FIG. 7 is a schematic block diagram of a system for compensating for a leakage current in accordance with a fourth embodiment of the invention.

Referring now to FIG. 7, a system for compensating for a leakage current is illustrated and generally designated 70. The system 70 is functionally identical to the embodiment of FIG. 2, except that all or a portion of the analog circuit of FIG. 2 comprises one or more digital signal processors (DSPs), microcontrollers, and/or other digital processors.

By non-limiting example, the system 70 of FIG. 7 includes a DSP 72 for open-loop and/or closed-loop compensation of the measured leakage current. The system 70 also includes a first analog-to-digital converter (ADC) 74 electrically coupled to the output of the open-loop measurement circuit and a second ADC 76 electrically coupled to the output of the closed-loop measurement circuit. Each ADC 74, 76 converts an analog input (as received from a transimpedance amplifier 26, 28) into a digital signal for the DSP 72. The DSP 72 then performs an open loop reduction and/or a closed loop reduction of the leakage current. The closed loop reduction includes summing the open loop feedback (which is relatively constant) of the first transimpedance amplifier 26 with the closed loop feedback of the second transimpedance amplifier 28. The summed current measurement is output to the current injector 22 for injecting a compensation current into the PE conductor 20. In this regard, the DSP 72 causes the current injector 22 to inject a modified compensation current to reduce the leakage current according to the closed-loop control function, optionally to less than a predetermined threshold.

Embodiments of the invention are not limited to the foregoing, as the present invention can include digital substitutes for either or both of the current injector 22 and the virtual ground circuit 24. For example, the current injector 22 can comprise a class D amplifier for converting a low-voltage DC input into a higher-voltage DC output. Instead of continuously varying the compensation current using an analog amplifier (e.g., class A, B, and AB amplifiers), a class D amplifier modulates the duty cycle of a pulse-width-modulated (PWM) waveform based on the input voltage (from the DSP 72) and the desired output voltage. By controlling the duty cycle, the class D amplifier regulates the compensation current while minimizing power losses. As also shown in FIG. 7, the virtual ground circuit 24 can comprise a second DSP in combination with an ADC and a digital-to-analog converter (DAC). For example, the second DSP can actively maintain the DC average of virtual ground to be the same as the potential in the PE conductor 20. In particular, the second DSP can amplify the voltage difference between the PE conductor 20 and a virtual ground node ($V_{gnd}$), while rejecting any signals that are common to both inputs, such as noise or interference. The DSP then generates a supply current for the current injector 22, which allows the LCC circuit 70 to operate over a wider range of $V_{gnd}$.

The above description is that of current embodiment of the invention. Various alterations and changes can be made without departing from the spirit and broader aspects of the invention. This disclosure is presented for illustrative purposes and should not be interpreted as an exhaustive description of all embodiments of the invention or to limit the scope of the claims to the specific elements illustrated or described in connection with these embodiments. Any reference to elements in the singular, for example, using the articles "a," "an," "the," or "said," is not to be construed as limiting the element to the singular.

The invention claimed is:

1. A leakage current compensator circuit comprising:
 a plurality of current carrying wires electrically coupled to a power supply and an electrical load, each of the power supply and the electrical load including a protective earth terminal;
 a protective earth conductor electrically coupled to the protective earth terminal of the power supply and the protective earth terminal of the electrical load;
 a measurement circuit for measuring a leakage current in the plurality of current carrying wires, wherein the measurement circuit comprises:
  an open loop measurement coil configured to measure a leakage current in the plurality of current carrying wires and configured to provide a first output signal representing the measured leakage current,
  a closed loop measurement coil configured to measure a compensated leakage current in the plurality of current carrying wires after application of a compensation current and configured to provide a second output signal representing the compensated leakage current; and a current injector that is configured to apply a dynamic compensation current to the protective earth conductor, the current injector being electrically coupled to the plurality of current carrying wires, wherein the current injector is configured to actively cancel the leakage current in the plurality of current carrying wires by:

generating the dynamic compensation current based on the first output signal from the open loop measurement coil, and modifying the dynamic compensation current based on the second output signal from the closed loop measurement coil, such that the dynamic compensation current is adjusted according to a closed loop control function to reduce the leakage current in the plurality of current carrying wires.

2. The circuit of claim 1, wherein:

each of the open loop measurement coil and the closed loop measurement coil includes a current transformer having a toroid extending around the plurality of current carrying wires.

3. The circuit of claim 2, wherein the current injector is electrically coupled to the plurality of current carrying wires between the open loop measurement coil and the closed loop measurement coil.

4. The circuit of claim 3, wherein the output of the open loop measurement coil is coupled to a first transimpedance amplifier; and wherein the output of the closed loop measurement coil is coupled to a second transimpedance amplifier.

5. The circuit of claim 4, wherein each of the first transimpedance amplifier and the second transimpedance amplifier provide an output to an input terminal of a band-pass summing amplifier, the band-pass summing amplifier including a second input terminal coupled to a virtual ground node.

6. The circuit of claim 5, wherein the current injector includes a first input terminal coupled to an output of the band-pass summing amplifier and a second input terminal coupled to the virtual ground node.

7. The circuit of claim 4, further including a plurality of grid configuration relays that are electrically connected between the plurality of current carrying wires and the virtual ground node.

8. The circuit of claim 4, further including a virtual ground control circuit for regulating the virtual ground node.

9. The circuit of claim 1, wherein the electrical load includes a non-isolated onboard charger for an electric vehicle.

10. A method for compensating a leakage current in a grid-connected device, the grid-connected device being electrically connected to a plurality of current carrying wires and a protective earth conductor, the method comprising:

measuring a first leakage current in the plurality of current carrying wires based on the output of an open loop measurement circuit;

injecting a compensation current into the protective earth conductor based on the measured first leakage current to provide an open loop leakage current reduction;

measuring a second leakage current in the plurality of current carrying wires based on the output of a closed loop measurement circuit; and modifying the compensation current based on the measured second leakage current to provide a closed loop leakage current reduction, wherein:

the compensation current is generated based on the measured first leakage current from the open loop measurement circuit, and the compensation current is modified based on the measured second leakage current from the closed loop measurement circuit according to a closed loop control function.

11. The method of claim 10, further including converting the first leakage current into an output voltage at a first transimpedance amplifier.

12. The method of claim 11, further including converting the second leakage current into an output voltage at a second transimpedance amplifier.

13. The method of claim 12, further including summing the output voltage of the first transimpedance amplifier and the output voltage of the second transimpedance amplifier at an input terminal of a band-pass summing amplifier.

14. The method of claim 13, wherein providing the closed loop leakage current reduction is performed by a current injector having a first input terminal coupled to the output of the band-pass summing amplifier and having a second input terminal coupled to a virtual ground node.

15. A system for compensating for a leakage current, the system comprising:

a measurement circuit configured to measure a leakage current in a plurality of current carrying wires that are electrically connected between a power supply and an electrical load, wherein the measurement circuit includes:

an open loop measurement coil configured to measure the leakage current in the plurality of current carrying wires and configured to provide a first output signal representing the measured leakage current, a closed loop measurement coil configured to measure a compensated leakage current in the plurality of current carrying wires after application of a compensation current and configured to provide a second output signal representing the compensated leakage current;

a current injector configured to apply the compensation current to a protective earth conductor that is electrically connected between the power supply and the electrical load; and a processor electrically connected to the open loop measurement coil of the measurement circuit, the closed loop measurement coil of the measurement circuit, and the current injector, the processor being configured to determine the compensation current according to:

an open loop gain function based on the first output signal from the open loop measurement coil, and a closed loop gain function based on the second output signal from the closed loop measurement coil, the processor being further configured to cause the current injector to generate the compensation current based on the first output signal from the open loop measurement coil and modify the compensation current based on the second output signal from the closed loop measurement coil according to a closed loop control function, wherein the processor is further configured to cause the current injector to apply the compensation current to the protective earth conductor to reduce the leakage current.

16. The system of claim 15, wherein the measurement circuit includes at least one current transformer having a toroid extending around the plurality of current carrying wires for output to the processor, the processor including at least one analog-to-digital converter.

17. The system of claim 15, wherein the current injector includes a first input terminal coupled to an output of the processor and a second input terminal coupled to a virtual ground node.

18. The system of claim 17, wherein the processor is configured to maintain a DC average of the virtual ground node to be the same as the protective earth conductor.

19. The system of claim 17, further including a plurality of grid configuration relays that are electrically connected between the plurality of current carrying wires and the virtual ground node, wherein the plurality of grid configuration relays are responsive to the processor for use with a three-phase electrical supply, a split-phase electrical supply, or a single-phase electrical supply.

\* \* \* \* \*